United States Patent
Tokusho

(10) Patent No.: US 10,957,562 B2
(45) Date of Patent: Mar. 23, 2021

(54) HEATING DEVICE

(71) Applicant: NGK SPARK PLUG CO., LTD., Aichi (JP)

(72) Inventor: Noriaki Tokusho, Tsuruoka (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 670 days.

(21) Appl. No.: 15/793,268

(22) Filed: Oct. 25, 2017

(65) Prior Publication Data

US 2018/0122658 A1    May 3, 2018

(30) Foreign Application Priority Data

Oct. 28, 2016    (JP) .............................. JP2016-212349

(51) Int. Cl.
*H01L 21/67*    (2006.01)
*H05B 3/28*    (2006.01)
(Continued)

(52) U.S. Cl.
CPC ........ *H01L 21/67103* (2013.01); *C03B 25/00* (2013.01); *H01L 21/67109* (2013.01); *H01L 21/68785* (2013.01); *H05B 3/22* (2013.01); *H05B 3/28* (2013.01); *F28D 2021/0077* (2013.01); *H01L 21/324* (2013.01)

(58) Field of Classification Search
CPC ......... H01L 21/67103; H01L 21/67109; H01L 21/68785; H01L 21/324; H01L 21/6831; H01L 21/6833; H01L 2924/0002; H01L 2924/00; C03B 25/00; H05B 3/22; H05B 3/28; F28D 2021/0077; C23C 16/4586; B05C 21/00; H02N 13/00; H01J 37/32431

USPC ...... 219/158; 118/500, 517; 361/234, 274.1, 361/274.2, 676, 679.46, 379.47, 688–697, 361/831

See application file for complete search history.

(56) References Cited

U.S. PATENT DOCUMENTS 5,688,331 A * 11/1997 Aruga ............... C23C 16/45521
                                                           118/725
8,274,017 B2 * 9/2012 Yap .................... H01L 21/68792
                                                           219/385

(Continued)

FOREIGN PATENT DOCUMENTS

JP    2014-175491 A    9/2014

*Primary Examiner* — Dana Ross
*Assistant Examiner* — Michael S. Poetzinger
(74) *Attorney, Agent, or Firm* — Stites & Harbison, PLLC; Jeffrey A. Haeberlin; James R. Hayne

(57) ABSTRACT

A heating device includes a base body that has a placement surface for placing a wafer thereon and a back surface that is on an opposite side of the placement surface; a heating resistor that is embedded in the base body; a cylindrical supporting body that has one end surface and the other end surface, the one end surface being connected to the back surface of the base body, the other end surface being on an opposite side of the one end surface; and a supporting-body channel that includes a portion extending in a direction from the other end surface to the one end surface of the cylindrical supporting body, and that is formed within a peripheral wall of the cylindrical supporting body. The supporting-body channel includes an opening portion that opens inwardly from an outer peripheral surface of the cylindrical supporting body.

9 Claims, 3 Drawing Sheets

(51) Int. Cl.
    *C03B 25/00*     (2006.01)
    *H01L 21/687*     (2006.01)
    *H05B 3/22*     (2006.01)
    *F28D 21/00*     (2006.01)
    *H01L 21/324*     (2006.01)

(56) References Cited

U.S. PATENT DOCUMENTS

| | | | |
|---|---|---|---|
| 8,753,447 B2 * | 6/2014 | Lind | C23C 16/4401 |
| | | | 118/725 |
| 2010/0317197 A1 * | 12/2010 | Lind | C23C 16/4401 |
| | | | 438/758 |
| 2011/0147363 A1 * | 6/2011 | Yap | H01L 21/67109 |
| | | | 219/385 |
| 2015/0376783 A1 | 12/2015 | Hanamachi et al. | |

\* cited by examiner

HEATING DEVICE

CROSS REFERENCE TO RELATED APPLICATION

The present invention claims priority to Japanese Patent Application No. 2016-212349, which was filed on Oct. 28, 2016, the disclosure of which is herein incorporated by reference in its entirety.

BACKGROUND OF THE INVENTION

Field of the Invention

The present invention relates to a heating device that heats, for example, a substrate, such as a wafer or a glass substrate for manufacturing a semiconductor device.

Description of the Related Art

Hitherto, in order to control the temperature of a placement surface for placing thereon a wafer for manufacturing a semiconductor device, a known heating device has included a heating resistor that is embedded in a base body made of a ceramic sintered material (refer to, for example, PTL 1).

PATENT LITERATURE

PTL 1 is Japanese Unexamined Patent Application Publication No. 2014-175491.

SUMMARY OF THE INVENTION

In existing heating devices, depending upon a substrate that is placed on a placement surface of a base body, a temperature difference between a central portion and an outer portion of the base body may be desired. In order to provide a temperature difference between the central portion and the outer portion of the base body, one may consider providing a plurality of heating resistors. However, with the sizes of heating devices being reduced, there is a limit to the amount of wires that can be inserted into a cylindrical supporting body that supports a substrate. Therefore, it is difficult to provide a plurality of heating resistors.

Accordingly, in view of the above-described points, it is an object of the present invention to provide a heating device that allows a temperature difference between a central portion and an outer portion of a placement surface of a base body to be adjusted without increasing the number of heating resistors.

1. To this end, according to the present invention, there is provided a heating device including a base body that has a placement surface for placing a substrate thereon and a back surface that is on an opposite side of the placement surface; a heating resistor that is embedded in the base body; a cylindrical supporting body that has one end surface and the other end surface, the one end surface being connected to the back surface of the base body, the other end surface being on an opposite side of the one end surface; and a supporting-body channel that includes a portion extending in a direction from the other end surface to the one end surface of the cylindrical supporting body, and that is formed within a peripheral wall of the cylindrical supporting body. A channel including at least the supporting-body channel includes an opening portion that opens inwardly from an outer peripheral surface of the cylindrical supporting body and that is connected to a space that is defined by an inner peripheral surface of the cylindrical supporting body and the back surface of the base body. In other words, there is provided a heating device including a base body having a placement surface for placing a substrate thereon and a back surface opposite the placement surface. The heating device further includes a heating resistor embedded in the base body. The heating device further includes a cylindrical supporting body having one end surface connected to the back surface of the base body, an other end surface opposite the one end surface, an outer peripheral surface, and an inner peripheral surface. The cylindrical supporting body includes a peripheral wall defining a supporting-body channel. The supporting-body channel includes a portion defined within the peripheral wall of the cylindrical supporting body and extending in a direction from the other end surface to the one end surface of the cylindrical supporting body. The heating device defines a channel including the supporting-body channel and an opening portion that opens inwardly from the outer peripheral surface of the cylindrical supporting body and connects to a space defined by the inner peripheral surface of the cylindrical supporting body and the back surface of the base body.

According to the present invention, a central portion of the back surface of the base body can be cooled by a fluid that passes through the supporting-body channel via the opening portion. Therefore, a difference between the heating temperature of the central portion and the heating temperature of the outer portion can be provided without increasing the number of heating resistors and adjusting the output of the heating resistor.

2. In the present invention, the opening portion may be formed at at least the inner peripheral surface of the cylindrical supporting body. When the opening portion is provided at the inner peripheral surface of the cylindrical supporting body, compared to the case in which the opening portion is provided at the base body, the present invention is applicable to an existing heating device by only changing the design of the cylindrical supporting body. Therefore, the heating device according to the present invention can be easily manufactured.

3. In the present invention, it is desirable that the supporting-body channel includes a circumferential channel that extends in a circumferential direction of the cylindrical supporting body, and a plurality of the opening portions be provided so as to be connected to the circumferential direction channel. In other words, the supporting-body channel includes a circumferential direction channel that extends in a circumferential direction of the cylindrical supporting body and the opening portion of the channel includes a plurality of opening portions connected to the circumferential direction channel. According to such a structure, the central portion of the back surface of the base body can be uniformly cooled.

4. In the present invention, the back surface of the base body may have a grooved portion that is connected to the supporting-body channel, and that extends towards a center of the cylindrical supporting body in a radial direction; and a portion that is formed by the grooved portion of the channel may include the opening portion. In other words, the back surface of the base body defines a groove connected to the supporting-body channel with the groove extending in a radial direction towards a center of the cylindrical supporting body, and a portion of the groove of the base body includes the opening portion.

According to the present invention, when the grooved portion is formed, the area of the base body that contacts a fluid that flows through the supporting-body channel can be further increased, so that the cooling effect of the central portion of the base body can be increased.

5. In the present invention, it is desirable that heating device further include a fluid controlling section that causes a fluid to be supplied to the supporting-body channel (i.e., configured to supply a fluid to the supporting-body channel), or to be sucked from the supporting-body channel (i.e., configured to suck a fluid from the supporting-body channel). According to such a structure, a fluid can be supplied to the supporting-body channel, or sucked from the supporting-body channel.

BRIEF DESCRIPTION OF THE DRAWINGS

Illustrative aspects of the invention will be described in detail with reference to the following figures wherein.

DETAILED DESCRIPTION OF EXEMPLARY EMBODIMENTS OF THE INVENTION

A. First Embodiment

Figure 1:
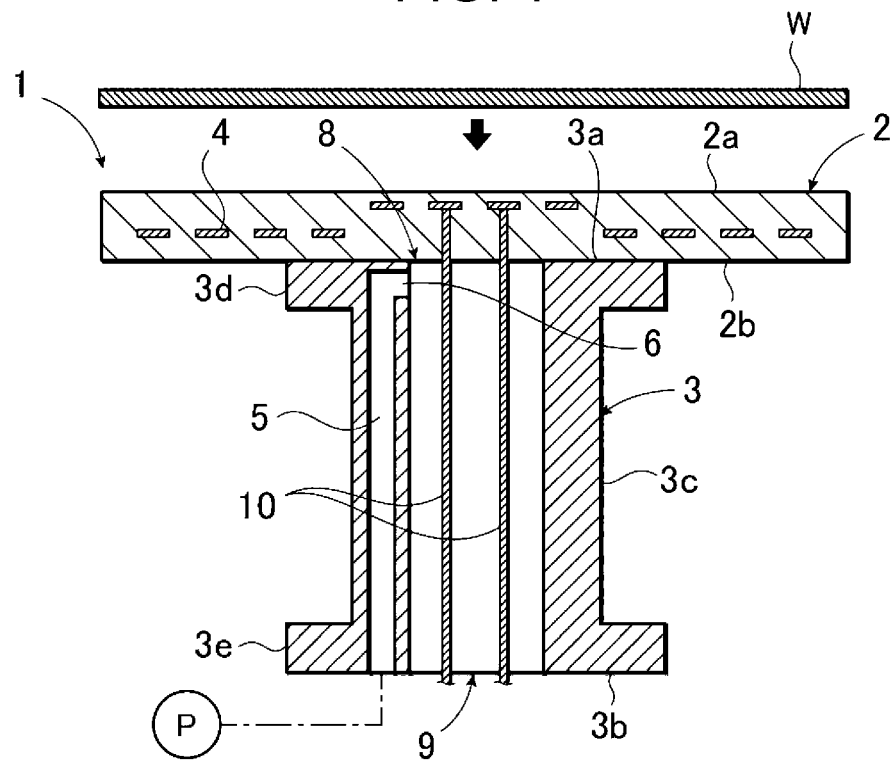
FIG. 1 is a sectional view of a heating device according to a first embodiment of the present invention.

A heating device according to a first embodiment of the present invention is described with reference to the drawings. As shown in FIG. 1, a heating device 1 according to the first embodiment includes a base body 2 and a cylindrical supporting body 3. The base body 2 includes a placement surface 2a for placing a wafer W as a substrate thereon, and a back surface 2b that is on the opposite side of the placement surface 2a. The cylindrical supporting body 3 has one end surface 3a, the other end surface 3b, and a smooth outer peripheral surface 3c. The cylindrical supporting body 3 may be a rectangular columnar supporting body.

The cylindrical supporting body 3 is hollow. An open end 8 is provided at the one end surface 3a, and an open end 9 is provided at the other end surface 3b. Flanges 3d and 3e that extend outward in a radial direction are provided at the respective ends portions of the cylindrical supporting body 3 along an entire periphery. The flanges 3d and 3e need not be provided along the entire periphery. The open end 8 that is provided at the one end surface 3a of the cylindrical supporting body 3 is connected to the back surface 2b of the base body 2.

A heating resistor 4 is embedded in the base body 2. A wire 10 for supplying electrical power to the heating resistor 4 is connected to the heating resistor 4 via the cylindrical supporting body 3.

Figure 2:
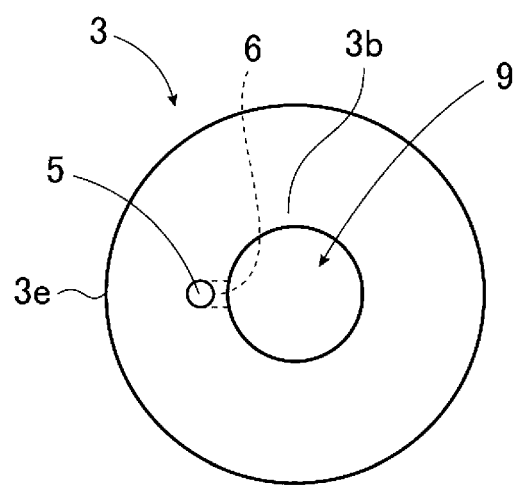
FIG. 2 is a bottom view of a cylindrical supporting body according to the first embodiment.

One supporting-body channel 5 extending in a direction from the other end surface 3b to the one end surface 3a is formed within a peripheral wall of the cylindrical supporting body 3. A plurality of the supporting-body channels 5 may be provided. FIG. 2 is a bottom view of the cylindrical supporting body 3 as seen from the side of the other end surface 3b. An inner peripheral surface of the cylindrical supporting body 3 has an opening portion 6 that connects the supporting body channel 5 and a space defined by the back surface 2b of the base body 2 and the inner peripheral surface of the cylindrical supporting body 3. The opening portion 6 is disposed near the one end surface 3a. Therefore, the opening portion 6 opens inwardly from the outer peripheral surface 3c of the cylindrical supporting body 3.

A fluid controlling section P is connected to the supporting-body channel 5. The fluid controlling section P causes a fluid (gas) to be supplied to the supporting-body channel 5, or a fluid (gas) in the cylindrical supporting body 3 to be sucked via the supporting-body channel 5.

The fluid controlling section P may have, for example, a structure in which a pressure control valve and a pressure gauge are provided at an upstream pipe that is connected to the supporting-body channel 5 and in which the value provided by the pressure gauge is fed back to the pressure control valve to control the pressure of a fluid (gas).

According to the heating device 1 of the first embodiment, when a fluid (gas) is made to flow via the opening portion 6 and the supporting-body channel 5 formed within the peripheral wall of the cylindrical supporting body 3, it is possible to cool only a central portion of the back surface 2b of the base body 2 that is positioned immediately above the cylindrical supporting body 3. Therefore, without increasing the number of new and different heating resistors and without adjusting the output of the heating resistor 4, the temperature difference between the central portion and an outer portion of the placement surface 2a of the base body 2 can be adjusted by adjusting the amount of fluid (gas) that is supplied or sucked.

The wire 10 for supplying electrical power to the heating resistor 4 is inserted in the space that is defined by the inner peripheral surface of the cylindrical supporting body 3. Since the wire 10 can be cooled by a fluid, a central portion of the base body 2 can be efficiently cooled.

When the opening portion 6 is provided at the inner peripheral surface of the cylindrical supporting body 3, compared to the case in which the opening portion 6 is provided at the base body 2, the present invention is applicable to an existing heating device by only changing the design of the cylindrical supporting body 3. Therefore, the heating device 1 can be easily manufactured.

The location of the opening portion 6 is not limited to the vicinity of the one end surface 3a. The opening portion 6 may also be formed so as to open at the one end surface 3a. Even if the opening portion 6 is formed in this way, the central portion of the back surface 2b of the base body 2 can be properly cooled.

The supporting-body channel 5 is described as one whose fluid supply port or suction port opens at the other end surface 3b. However, the fluid supply port or suction port of the supporting-body channel 5 may open at the outer peripheral surface 3c of the cylindrical supporting body 3, an outer peripheral surface of the flange 3e, or the inner peripheral surface of the cylindrical supporting body 3.

B. Second Embodiment

A heating device 1 according to a second embodiment of the present invention is described with reference to FIG. 3. Structural features that correspond to those according to the first embodiment are given the same reference numerals and are not described below. The structure of the heating device 1 according to the second embodiment differs from that of the first embodiment in that a back surface 2b of a base body 2 has a grooved portion 11.

The grooved portion 11 is connected to a supporting-body channel 5. The grooved portion 11 extends inwardly from an inner peripheral surface of a cylindrical supporting body 3 in a radial direction. A portion of the grooved portion 11 that is exposed at a space defined by the inner peripheral surface of the cylindrical supporting body 3 is an opening portion 6 according to the second embodiment. In other words, the grooved portion 11 extends towards the center of the cylindrical supporting body 3 in a radial direction, and a portion that is formed by the grooved portion 11 of a channel is the opening portion 6. The grooved portion 11 is formed at only an immediately overhead region of the cylindrical supporting body 3. Other structural features of the heating device 1 according to the second embodiment are the same as those according to the first embodiment.

According to the heating device 1 of the second embodiment, when the back surface 2b of the base body 2 has the grooved portion 11, the area of the base body 2 that contacts a fluid (gas) that flows through the supporting-body channel 5 can be further increased, so that the cooling effect of a central portion of the base body 2 can be increased.

Figure 3:
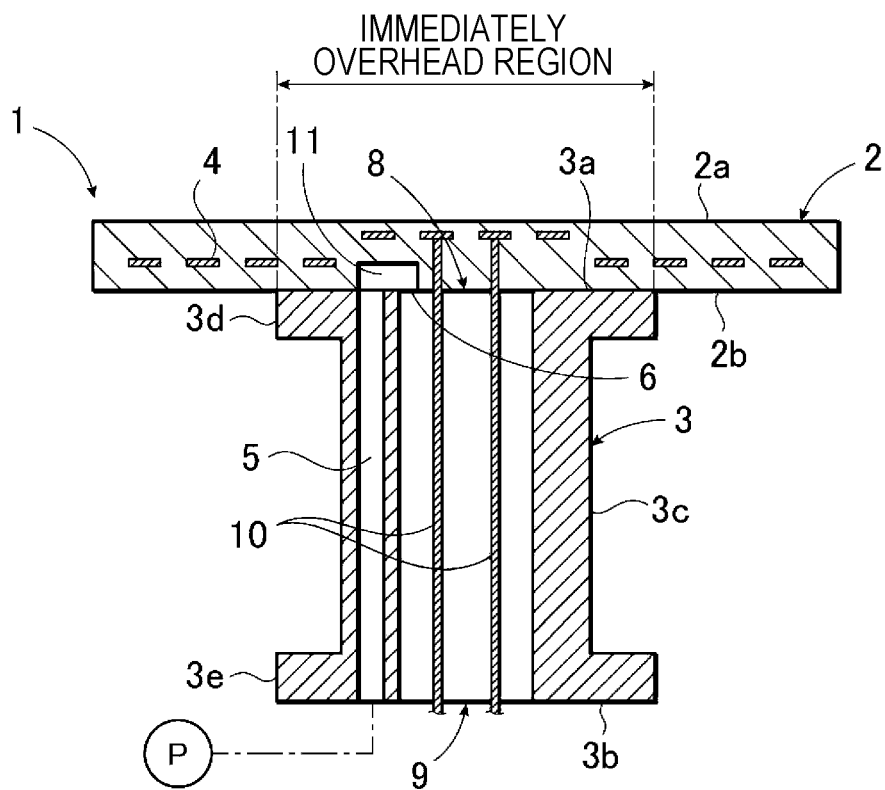
FIG. 3 is a sectional view of a heating device according to a second embodiment of the present invention.

Although FIG. 3 shows the opening portion 6 that is formed in the grooved portion 11, the opening portion according to the present invention is not limited thereto. In addition to the opening portion 6 of the grooved portion 11, for example, a different opening portion that opens at the inner peripheral surface of the cylindrical supporting body 3 may be added and connected to the supporting-body channel 5 as in the first embodiment. Alternatively, in addition to the grooved portion 11, another grooved portion may also be formed in a portion of one end surface 3a of the cylindrical supporting body 3 that overlaps the grooved portion 11 and an opening portion that opens at the back surface 2b of the base body 2 and the inner peripheral surface of the cylindrical supporting body 3 may be provided.

C. Third Embodiment

Figure 4:
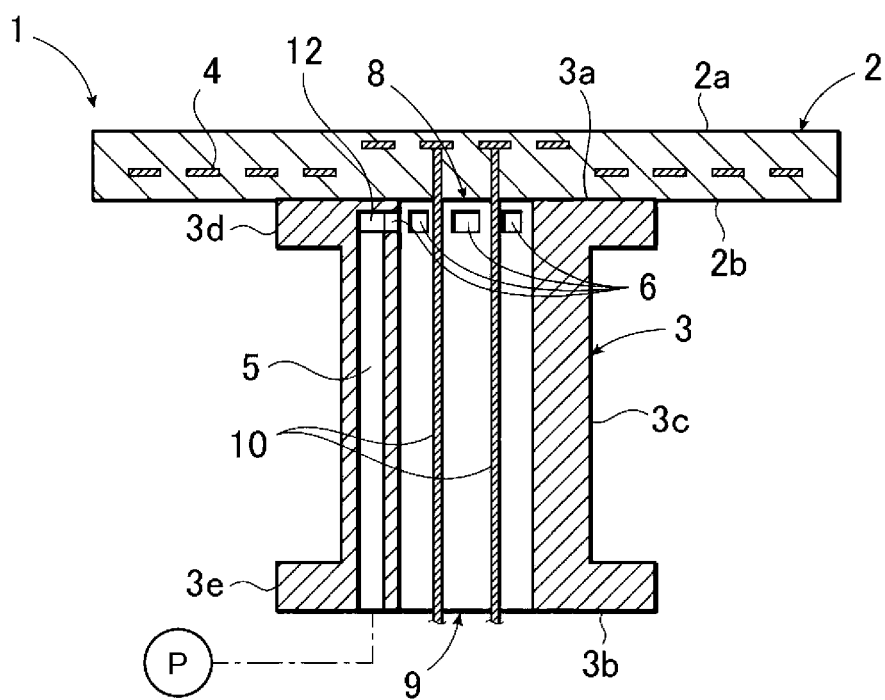
FIG. 4 is a sectional view of a heating device according to a third embodiment of the present invention.
Figure 5:
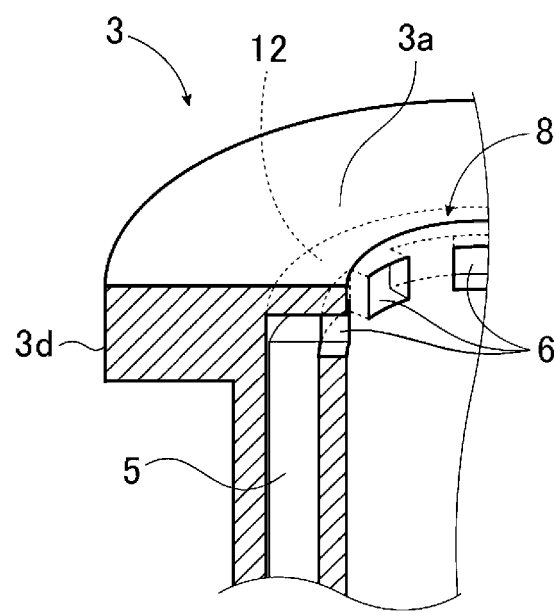
FIG. 5 is a perspective view of a heating device according to the third embodiment.

A heating device 1 according to a third embodiment of the present invention is described with reference to FIGS. 4 and 5. Structural features that correspond to those according to the first embodiment are given the same reference numerals and are not described below. A supporting-body channel 5 according to the third embodiment has a circumferential direction channel 12 that is positioned on the side of the one end surface 3a and that extends in a circumferential direction of a cylindrical supporting body. A plurality of opening portions 6 are provided so as to be connected to the circumferential direction channel 12. The other structural features are all the same as those according to the first embodiment.

Even in the heating device 1 according to the third embodiment, as in the first embodiment, when a fluid (gas) is made to flow via the opening portions 6 and the supporting-body channel 5 formed within a peripheral wall of a cylindrical supporting body 3, it is possible to cool only a central portion of a back surface 2b of a base body 2 that is positioned immediately above the cylindrical supporting body 3. Therefore, without increasing the number of new and different heating resistors and without adjusting the output of a heating resistor 4, the temperature difference between the central portion and an outer portion of a placement surface 2a of the base body 2 can be adjusted by adjusting the amount of fluid (gas) that flows.

Since a plurality of opening portions 6 are provided so as to exist apart from each other in a circumferential direction via the circumferential direction channel 12, the central portion of the back surface 2b of the base body 2 can be uniformly cooled by a fluid that is discharged or sucked from the plurality of opening portions 6.

Even in the heating device 1 according to the third embodiment, as in the second embodiment, the back surface 2b of the base body 2 may have a grooved portion that is connected to the supporting-body channel 5.

What is claimed is:

1. A heating device for heating a substrate, the heating device comprising:
   a base body having a placement surface on which a substrate to be heated is to be placed and a back surface opposite the placement surface;
   a heating resistor embedded in the base body; and
   a cylindrical supporting body having one end surface connected to the back surface of the base body, an other end surface opposite the one end surface, an outer peripheral surface, and an inner peripheral surface, the cylindrical supporting body including a peripheral wall defining
   a supporting-body channel, the supporting-body channel including a portion defined withing the peripheral wall of the cylindrical supporting body and extending in a direction from the other end surface to the one end surface of the cylindrical supporting body,
   wherein the heating devices defines a channel including the supporting-body channel and an opening portion that opens inwardly from the outer peripheral surface of the cylindrical supporting body and connects to a space defined by the inner peripheral surface of the cylindrical supporting body and the back surface of the base body such that the supporting-body channel is in fluid communication with the space defined by the inner peripheral surface of the cylindrical supporting body and the back surface of the base body.

2. The heating device according to claim 1, wherein the opening portion is formed at least at the inner peripheral surface of the cylindrical supporting body.

3. The heating device according to claim 2, wherein the supporting-body channel includes a circumferential direction channel that extends in a circumferential direction of the cylindrical supporting body, and
   wherein the opening portion of the channel includes a plurality of opening portions connected to the circumferential direction channel.

4. The heating device according to claim 1, wherein the back surface of the base body defines a groove connected to the supporting-body channel, the groove extending in a radial direction towards a center of the cylindrical supporting body, and
   wherein a portion of the groove of the base body includes the opening portion.

5. The heating device according to claim 1, further comprising:
   a fluid controlling section configured to supply a fluid to the supporting-body channel, or suck a fluid from the supporting-body channel.

6. The heating device according to claim 1, wherein the substrate is a wafer for manufacturing a semiconductor device.

7. The heating device according to claim 1, wherein the substrate is a glass substrate for manufacturing a semiconductor device.

8. The heating device according to claim 1, wherein the base body is made of a ceramic.

9. The heating device according to claim 1, wherein the base body is in the shape of a plate.

\* \* \* \* \*

UNITED STATES PATENT AND TRADEMARK OFFICE
CERTIFICATE OF CORRECTION

PATENT NO. : 10,957,562 B2
APPLICATION NO. : 15/793268
DATED : March 23, 2021
INVENTOR(S) : Noriaki Tokusho Page 1 of 1

It is certified that error appears in the above-identified patent and that said Letters Patent is hereby corrected as shown below:

In the Claims

Claim 1, Column 6, Line 23, replace "withing" with "within"

Signed and Sealed this
Fourth Day of May, 2021

Drew Hirshfeld
*Performing the Functions and Duties of the*
*Under Secretary of Commerce for Intellectual Property and*
*Director of the United States Patent and Trademark Office*